(12) United States Patent
Plug et al.

(10) Patent No.: US 9,406,826 B2
(45) Date of Patent: Aug. 2, 2016

(54) FLEXIBLE ELECTRICAL GENERATORS

(75) Inventors: Johannes Petrus Marinus Plug, Stevensweert (NL); Leonardus Jacobus Johannus Wilhemus Welzen, Urmond (NL); Fanciscus Gerardus Henricus Van Duijnhoven, Mierlo (NL); Josephina Johanna Maria Gerarda Swagten, Roosteren (NL)

(73) Assignee: DSM IP ASSETS B.V., Heerlen (NL)

( * ) Notice: Subject to any disclaimer, the term of this patent is extended or adjusted under 35 U.S.C. 154(b) by 328 days.

(21) Appl. No.: 13/978,467

(22) PCT Filed: Nov. 18, 2011

(86) PCT No.: PCT/EP2011/070497
§ 371 (c)(1),
(2), (4) Date: Jul. 5, 2013

(87) PCT Pub. No.: WO2012/066136
PCT Pub. Date: May 24, 2012

(65) Prior Publication Data
US 2013/0284267 A1    Oct. 31, 2013

(30) Foreign Application Priority Data

Nov. 18, 2010  (EP) .................................... 10191692

(51) Int. Cl.
| *H01L 31/0203* | (2014.01) |
| *H02S 30/20* | (2014.01) |
| *H01L 51/00* | (2006.01) |
| *H01L 31/048* | (2014.01) |
| *H01L 51/42* | (2006.01) |

(52) U.S. Cl.
CPC ............ *H01L 31/045* (2013.01); *H01L 31/048* (2013.01); *H01L 51/0097* (2013.01); *H02S 30/20* (2014.12); *H01L 51/42* (2013.01); *Y02E 10/549* (2013.01)

(58) Field of Classification Search
CPC .... H01L 31/0392; H01L 31/048; H02S 30/20
USPC ......................................................... 136/251
See application file for complete search history.

(56) References Cited

U.S. PATENT DOCUMENTS

| 5,273,608 | A | * | 12/1993 | Nath ............................ 156/301 |
| 5,308,689 | A | * | 5/1994 | Shinkai et al. .................. 442/76 |
| 6,054,178 | A | * | 4/2000 | Howells ........................ 427/209 |
| 2009/0258965 | A1 | * | 10/2009 | Lassila et al. ................. 523/116 |
| 2010/0154857 | A1 | * | 6/2010 | Tell et al. ...................... 136/244 |

FOREIGN PATENT DOCUMENTS

| CN | 101 132 031 | 1/2008 |
| JP | 11-291419 | 10/1999 |
| JP | H11-291419 | * 10/1999 |

OTHER PUBLICATIONS

International Search Report for PCT/EP2011/070497 mailed Feb. 3, 2012.
M.B. Schubert et al., "Flexible Solar Cells for Clothing", Materials Today, vol. 9, No. 6, Jun. 1, 2006, pp. 42-50.

* cited by examiner

*Primary Examiner* — Jayne Mershon
(74) *Attorney, Agent, or Firm* — Nixon & Vanderhye P.C.

(57) ABSTRACT

The invention relates to a flexible electrical generator comprising at least one photovoltaic device and a flexible support, wherein said photovoltaic device is attached to the flexible support and wherein the flexible support comprises a fabric comprising high-strength polymeric fibers, said flexible support comprising also a plastomer wherein said plastomer is a semi-crystalline copolymer of ethylene or propylene and one or more C2 to C12 α-olefin co-monomers and wherein said plastomer having a density as measured according to ISO1183 of between 860 and 930 kg/m$^3$.

13 Claims, No Drawings

US 9,406,826 B2

FLEXIBLE ELECTRICAL GENERATORS

This application is the U.S. national phase of International Application No. PCT/EP2011/070497 filed 18 Nov. 2011 which designated the U.S. and claims priority to EP 10191692.2 filed 18 Nov. 2010, the entire contents of each of which are hereby incorporated by reference.

The invention relates to the field of electrical generators, in particular to those capable of converting solar radiation into electrical energy.

BACKGROUND OF THE INVENTION

Electrical generators which convert or transform solar radiation into electrical energy typically include a photovoltaic device which usually is mounted on a support. Said photovoltaic device is also referred in the art as a solar cell. Energy conversion occurs as a result of what is known as a photovoltaic effect, i.e. solar radiation impinging on the solar cell generates electricity when absorbed by an active region thereof. The active region usually contains a semiconductor material, which may be made of a rigid single-crystal silicon, poly-crystal silicon or glass. Solar cells having a rigid active region are usually referred to in the art as rigid solar cells. Although rigid solar cells offer a clean and efficient source of energy, the rigid substrates thereof have several drawbacks in that they are fragile, bulky and minimize the acceptability of solar cells in many applications.

To alleviate the above mentioned drawbacks, solar cells on flexible substrates were developed, an example thereof being mentioned in U.S. Pat. No. 6,548,751. Such solar cells on flexible substrates are usually referred to in the art as flexible solar cells. U.S. Pat. No. 6,548,751 describes a thin-film flexible solar cell built on a plastic substrate which comprises a cadmium telluride p-type layer and a cadmium sulfide n-type layer sputter deposited onto a plastic substrate at a temperature sufficiently low to avoid damaging or melting the plastic and to minimize crystallization of the cadmium telluride. A transparent conductive oxide layer overlaid by a bus bar network is deposited over the n-type layer. A back contact layer of conductive metal is deposited underneath the p-type layer and completes the current collection circuit. The semiconductor layers may be amorphous or polycrystalline in structure.

A flexible electrical generator is also known from CN2838046, whereas CN101132031 describes a method for making the same. CN2838046 describes a plurality of rigid solar cells which are connected to a flexible bottom material, i.e. a flexible support. The flexible support may comprise textile fabrics or plastic films. A gap is left between the adjacent edges of every two solar cells and the solar cells are connected in series to form a larger foldable electrical generator. Each solar cell comprises an upper and a lower adhesive layer and an upper and a lower outer layer of a transparent polytetrafluoroethylene composite material, wherein the upper outer layer is larger than other layers to form a hanging circumference. Connecting holes can be distributed on said hanging circumference for affixing the solar cell to the flexible substrate. The solar cells are flat arranged on the flexible substrate and glued or stitched through a line with the flexible bottom material through the circumference of the upper outer layer. The electrical generator of CN2838046 has the advantages of a good flexibility and folding property and can be used for example in garments.

A vehicle roof having a main part covered with organic type solar cells for capturing solar energy and transforming it into electric energy to power a part of electrical equipments of a vehicle is known from FR2934206. The roof is flexible and foldable and can be opened or closed. The solar cells are fixed on a polymer strip fixed on the roof and protected externally by a transparent synthetic layer.

It was observed however that in the known flexible electrical generators such as the ones disclosed above, the plastic substrate of the solar cells used therein is fragile and can be easily damaged or broken. Also the electrical generators comprising flexible supports onto which rigid or flexible solar cells are affixed have the above mentioned disadvantages, i.e. they are fragile and have a rather short lifetime. In particular it was observed that large sized flexible solar cells must be supported on rigid supports such as rigid roofs or rigid panels. If not supported, large sized flexible solar cells are susceptible to break under their own weight or under external forces generated by hostile environmental factors such as winds, impacts from debris carried by the wind, accumulated rain water and the like. These drawbacks were partially alleviated by the flexible solar cell disclosed in US 2010/239797.

US 2010/239797 discloses a flexible solar cell wherein a layered material is used, said layered material comprising a layer of ultrahigh molecular weight polyethylene fibers which is surrounded on each of the sides by a film made of polyethylene or polypropylene. According to US 2010/239797 the layered material is lightweight and has high stability or tear resistance and a high modulus of elasticity.

It was observed however that the flexible solar cells of US 2010/239797 have a reduced mechanical stability in that the textile fabric support elongates and/or shrinks during utilization in hostile environments. Due to its pronounced mechanical instability, the textile fabric used as support induces mechanical loads on the solar cells mounted thereon. These mechanical loads negatively influence the durability of the solar cells and may lead to damages or even complete failure thereof.

An aim of the present invention may therefore be to provide a flexible electrical generator which presents the above mentioned disadvantages to a lesser extent. A particular aim of the invention may be to provide a flexible electrical generator which has a better durability than the known electrical generators. A further aim of the present invention is to provide a self-supporting, large sized, flexible electrical generator which has a good mechanical stability, e.g. a reduced elongation and/or shrinkage during its lifetime.

SUMMARY OF THE INVENTION

The invention provides a flexible electrical generator comprising at least one photovoltaic device and a flexible support, wherein said photovoltaic device is attached to the flexible support and wherein the flexible support comprises a fabric comprising high-strength polymeric fibers, said flexible support comprising also a plastomer wherein said plastomer is a semi-crystalline copolymer of ethylene or propylene and one or more C2 to C12 α-olefin co-monomers and wherein said plastomer having a density as measured according to ISO1183 of between 860 and 930 kg/m$^3$.

It was observed that the flexible electrical generator of the invention may withstand with success forces, also referred to herein as loads, generated by environmental factors such as winds, impacting debris and the like. In particular it was observed that the flexible electrical generator of the invention has a good mechanical stability. More in particular it was observed that the flexible electrical generator of the invention may be able to effectively dissipate and minimize the influence of external loads acting thereon. More in particular it was observed that the generator of the invention may have a good durability and prolonged lifetime.

DETAILED DESCRIPTION OF THE INVENTION

By a flexible electrical generator is herein understood a generator which may be folded or bended. A measure of the flexibility of the generator of the invention may be when a sample of the generator having a supported end, i.e. the end thereof which is placed on a rigid support such as a table, a free end, i.e. the unsupported end, and a length of 500 mm between the rigid support and the free end will deflect under its own weight with an angle of preferably more than 10 deg, more preferably of more than 30 deg, with respect to the horizontal.

The generator of the invention comprises at least one photovoltaic device. All known photovoltaic devices are suitable to be used in accordance with the present invention. The preferred photovoltaic devices however are those of flexible type, e.g. at least the ones disclosed in U.S. Pat. No. 6,548, 751; U.S. Pat. No. 3,459,391; U.S. Pat. No. 3,785,590; U.S. Pat. No. 3,658,596; JP57143874; JP63107073; US2002005457; WO08044802 incorporated herein by reference. Rigid photovoltaic devices may also be used, in this case the flexibility of the electrical generator of the invention being ensured for example by using a multitude of such rigid devices placed next to each other to form an array of devices and connected to each other to form an electrical circuit, wherein a gap exists between at least some of the adjacent rigid devices. A suitable configuration of a flexible electrical generator containing an array of rigid photovoltaic devices is described for example in CN2838046 incorporated herein by reference. The size of, number of and the gaps between the rigid photovoltaic devices can be routinely adjusted by the skilled person to obtain the desired flexibility of the generator. According to the invention, the fabric contained by the flexible support contains high strength polymeric fibers. By fiber is herein understood an elongated body having a length dimension and transverse dimensions, e.g. a width and a thickness, wherein the length dimension is much greater that the transverse dimensions. The term fiber also includes various embodiments e.g. a filament, a ribbon, a strip, a band, a tape and the like having regular or irregular cross-sections. Preferably, the fiber has a continuous length unlike staple fibers which have discontinuous lengths. A yarn for the purpose of the invention is an elongated body containing a plurality of fibers.

Suitable polymeric yarns or fibers that may be used in accordance with the invention include but are not limited to yarns or fibers manufactured from polymeric materials such as polyamides and polyaramides, e.g. poly(p-phenylene terephthalamide) (known as Kevlar®); poly(tetrafluoroethylene) (PTFE); poly{2,6-diimidazo-[4,5b-4',5'e]pyridinylene-1,4(2,5-dihydroxy)phenylene} (known as M5); poly(p-phenylene-2,6-benzobisoxazole) (PBO) (known as Zylon®); poly(hexamethyleneadipamide) (known as nylon 6,6), poly (4-aminobutyric acid) (known as nylon 6); polyesters, e.g. poly(ethylene terephthalate), poly(butylene terephthalate), and poly(1,4 cyclohexylidene dimethylene terephthalate); polyvinyl alcohols; thermotropic liquid crystal polymers (LCP) as known from e.g. U.S. Pat. No. 4,384,016; but also polyolefins other than polyethylene e.g. homopolymers and copolymers of polypropylene. Also yarns containing combinations of fibers manufactured from the above referred polymers can be used In a preferred embodiment, the polymeric fibers are polyolefin fibers, more preferably polyethylene fibers. Good results may be obtained when the polyethylene fibers are high molecular weight polyethylene (HMWPE) fibers, more preferably ultrahigh molecular weight polyethylene (UHMWPE) fibers. Polyethylene fibers may be manufactured by any technique known in the art, preferably by a melt or a gel spinning process. If a melt spinning process is used, the polyethylene starting material used for manufacturing thereof preferably has a weight-average molecular weight between 20,000 and 600,000 g/mol, more preferably between 60,000 and 200,000 g/mol. An example of a melt spinning process is disclosed in EP 1,350,868 incorporated herein by reference. Most preferred polymeric fibers are gel spun UHMWPE fibers, e.g. those sold by DSM Dyneema under the name Dyneema®. When the gel spinning process is used to manufacture said fibers, preferably an UHMWPE is used with an intrinsic viscosity (IV) of preferably at least 3 dl/g, more preferably at least 4 dl/g, most preferably at least 5 dl/g. Preferably the IV is at most 40 dl/g, more preferably at most 25 dl/g, more preferably at most 15 dl/g. Preferably, the UHMWPE has less than 1 side chain per 100 C atoms, more preferably less than 1 side chain per 300 C atoms. Preferably the UHMWPE fibers are manufactured according to a gel spinning process as described in numerous publications, including EP 0205960 A, EP 0213208 A1, U.S. Pat. No. 4,413,110, GB 2042414 A, GB-A-2051667, EP 0200547 B1, EP 0472114 B1, WO 01/73173 A1, EP 1,699,954 and in "Advanced Fibre Spinning Technology", Ed. T. Nakajima, Woodhead Publ. Ltd (1994), ISBN 185573 182 7.

In a special embodiment, the polymeric fiber used in accordance to the invention is a tape, more preferably an UHMWPE tape. A tape (or a flat tape) for the purposes of the present invention is a fiber with a cross sectional aspect ratio, i.e. ratio of width to thickness, of at least 5:1, more preferably at least 20:1, even more preferably at least 100:1 and yet even more preferably at least 1000:1. The tape preferably has a width of between 1 mm and 600 mm, more preferable between 1.5 mm and 400 mm, even more preferably between 2 mm and 300 mm, yet even more preferably between 5 mm and 200 mm and most preferably between 10 mm and 180 mm. The tape preferably has a thickness of between 10 µm and 200 µm and more preferably between 15 µm and 100 µm. By cross sectional aspect ratio is herein understood the ratio of width to thickness.

Preferably, the polymeric fibers employed by the invention have deniers in the range of from 0.5 to 20, more preferably from 0.7 to 10, most preferably from 1 to 5 dpf. The yarns containing said fibers preferably have deniers in the range of from 100 to 3000, more preferably from 200 to 2500, most preferably from 400 to 1000 dtex.

By high strength fibers is understood herein fibers that have a high tensile strength of e.g. at least 0.5 GPa. The tensile strength of the polymeric fibers is preferably at least 1.2 GPa, more preferably at least 2.5 GPa, most preferably at least 3.5 GPa. Preferably, the polymeric fibers are polyethylene fibers, more preferably UHMWPE fibers having a tensile strength of preferably at least 1.2 GPa, more preferably at least 2.5 GPa, most preferably at least 3.5 GPa. A flexible support containing a fabric manufactured from strong polyethylene fibers has a better mechanical stability, is lighter in weight and stronger than any other flexible supports having the same construction but which contain fabrics manufactured from e.g. polyester, nylon, aramid or glass fibers.

Preferably the polymeric fibers have a tensile modulus of preferably at least 30 GPa, more preferably of at least 50 GPa, most preferably of at least 60 GPa. Preferably the polymeric fibers are polyethylene fibers, more preferably UHMWPE fibers, wherein tensile modulus of the polyethylene fibers and in particular of the UHMWPE fibers is at least 50 GPa, more preferably at least 60 GPa, most preferably at least 80 GPa. It was observed that when such high strength polyethylene and more in particular such high strength UHMWPE fibers are used in accordance with the invention, the flexible generator of the invention may have good mechanical stability, good lifetime and may be able to successfully withstand rather large external loads acting thereupon.

In a preferred embodiment of the invention, at least 80 mass %, more preferably at least 90 mass %, most preferably 100 mass % of the fibers contained by the flexible support are high strength fibers. More preferably, at least 80 mass %, more preferably at least 90 mass %, most preferably 100 mass % of the fibers contained by the flexible support are polyethylene fibers and more preferably UHMWPE fibers. The remaining mass % of fibers may consist of other polymeric fibers as enumerated hereinabove. It was observed that by using fabrics containing an increased mass % of polyethylene fibers and in particular fabrics wherein all polymeric fibers are polyethylene fibers, a flexible electrical generator in accordance with the invention may be obtained showing a good resistance to sun light and UV degradation, high tear strength and low weight.

The flexible support used in accordance to the invention comprises a fabric. Said fabric may be of any construction known in the art, e.g. woven, knitted, plaited, braided or non-woven or a combination thereof. Knitted fabrics may be weft knitted, e.g. single- or double-jersey fabric or warp knitted. An example of a non-woven fabric is a felt fabric or a fabric wherein the fibers run substantially along a common direction in a substantially parallel fashion. Further examples of woven, knitted or non-woven fabrics as well as the manufacturing methods thereof are described in "Handbook of Technical Textiles", ISBN 978-1-59124-651-0 at chapters 4, 5 and 6, the disclosure thereof being incorporated herein as reference. A description and examples of braided fabrics are described in the same Handbook at Chapter 11, more in particular in paragraph 11.4.1, the disclosure thereof being incorporated herein by reference.

Preferably the fabric used in accordance to the invention is a woven fabric. Preferably said woven fabric is constructed with a small weight per unit length and overall cross-sectional diameter. Preferred embodiments of woven fabrics suitable for manufacturing the flexible sheet of the invention include plain (tabby) weaves, rib weaves, matt weaves, twill weaves, basket weaves, crow feet weaves and satin weaves although more elaborate weaves such as triaxial weaves may also be used. More preferably the woven fabric is a plain weave, most preferably, the woven fabric is a basket weave. Preferably, the fibers used to manufacture the woven fabric are fibers having a rounded cross-section, said cross section having an aspect ratio of at most 4:1, more preferably at most 2:1.

According to the invention, the flexible support also contains a plastomer wherein the plastomer is a semi-crystalline copolymer of ethylene or propylene and one or more C2 to C12 α-olefin co-monomers and wherein said plastomer has a density as measured according to ISO1183 of between 860 and 930 kg/m$^3$.

The plastomer is preferably impregnated throughout the fabric contained by the flexible support, the impregnation being carried out in various forms and ways, for example by lamination or by forcing the plastomer through the yarns and/or the fibers of the fabric in e.g. a heated press. Examples of processes for the manufacturing of impregnated fabrics are disclosed for instance in U.S. Pat. No. 5,773,373; U.S. Pat. No. 6,864,195 and U.S. Pat. No. 6,054,178 included herein by reference. These processes can be routinely adapted for the materials, e.g. fibers, plastomer, utilized by the present invention.

Good results may be obtained when the plastomer has a tensile modulus of at most 0.6 GPa, more preferably of at most 0.4 GPa, most preferably of at most 0.2 GPa. Preferably, said plastomer has a tensile modulus of at least 0.01 GPa, more preferably of at least 0.05 GPa, most preferably of at least 0.1 GPa.

It was observed that when using such impregnated fabrics as a flexible support for photovoltaic devices, the mechanical stability of the electrical generator of the invention was improved. In particular the elongation and the shrinkage of the electrical generator under external loads were minimized. Therefore in such embodiment, less damaging loads are applied on the photovoltaic devices with one of the beneficial effects thereof being that the generator of the invention has a longer service life.

A preferred example of a flexible support suitable for the invention is a support comprising a woven fabric containing high strength polyethylene fibers, more preferably high strength UHMWPE fibers and which is impregnated with a plastomer which is a semi-crystalline copolymer of ethylene or propylene and one or more C2 to C12 α-olefin co-monomers and wherein said plastomer has a density as measured according to ISO1183 of between 860 and 930 kg/m$^3$. An electrical generator of the invention comprising such a flexible support shows enhanced tear resistance; good characteristics for outdoors usage and handling; excellent chemical and fire resistance. In particular impregnated woven fabrics containing polyethylene fibers and/or yarns show an excellent weight to strength ratio, they are lightweight and stronger than any impregnated fabric containing e.g. polyester, nylon, aramid or glass fibers.

In the most preferred embodiment of the invention, the flexible support comprises:
(i) a fabric, preferably a woven fabric, comprising yarns containing polyethylene fibers, preferably UHMWPE fibers;
(ii) a plastomer layer adhered to at least one surface of said woven fabric wherein said plastomer is a semi-crystalline copolymer of ethylene or propylene and one or more C2 to C12 α-olefin co-monomers and wherein said plastomer has a density as measured according to ISO1183 of between 860 and 930 kg/m$^3$.

It was noticed by the present inventors that an electrical generator of the invention comprising such a flexible support may show in addition to the above mentioned advantages, a proper resistance to shrinkage during its utilization especially in long term applications. It was also observed the said electrical generator is lightweight, has a good tear resistance and a high strength to break. It was furthermore observed that during its utilization in cold environments, said electrical generator is less affected by low temperature induced damages, e.g. cracks and the like.

Preferably, the flexible support comprises:
(i) a woven fabric comprising yarns containing polyethylene fibers, preferably UHMWPE fibers;
(ii) a plastomer layer having a first part adhered to one surface of said woven fabric and a second part impregnated between the yarns and/or the fibers of said fabric, the second part extending throughout said fabric and being cohesively connected to said first part; and wherein said plastomer is a semi-crystalline copolymer of ethylene or propylene and one or more C2 to C12

α-olefin co-monomers and wherein said plastomer has a density as measured according to ISO1183 of between 860 and 930 kg/m³.

It was further noticed that yet a better shrinkage resistance for the flexible electrical generator of the invention may be obtained when the plastomer layer adheres to both surfaces of the woven fabric, therefore encapsulating said fabric. Therefore, in a preferred embodiment, the flexible support comprises:
  (i) a woven fabric having an upper surface and a lower surface and comprising yarns containing polyethylene fibers, preferably UHMWPE fibers;
  (ii) a plastomer layer encapsulating said fabric, said plastomer layer having a first part adhered to said upper surface; a third part adhered to said lower surface; and a second part which is impregnated between the yarns and/or the fibers of said fabric and extends throughout said fabric, said second part being cohesively connected to said first and third part of said plastomer layer; wherein said plastomer is a semi-crystalline copolymer of ethylene or propylene and one or more C2 to C12 α-olefin co-monomers and wherein said plastomer has a density as measured according to ISO1183 of between 860 and 930 kg/m³.

Preferably said second part is impregnated between both the yarns and the fibers. The second part of the plastomer layer also extends throughout said fabric meaning that the plastomer is distributed along the lateral dimensions of the fabric as well as along the vertical dimension of the fabric between the surfaces thereof. Preferably, the impregnation is carried out such that said second part of the plastomer layer extends along the vertical dimension from one surface of the fabric all the way to the opposite surface thereof.

By a plastomer layer adhered to a surface of a fabric is herein understood that the plastomer grips by physical forces to the fibers of the fabric with which it comes into contact. It is however not essential for the invention that the plastomer actually chemically bonds to the surface of the fibers. It was observed that the plastomer used according to the invention has an increased grip on e.g. the polyethylene fibers as compared with other types of thermoplastic materials. In a preferred embodiment the surface of the polyethylene fibers is corrugated, have protrusions or hollows or other irregular surface configurations in order to improve the grip between the plastomer and the fiber.

By two cohesively connected parts of the plastomer layer is herein understood that said parts are fused together into a single body such that preferably no line of demarcation is formed therein between and preferably no substantial variations of mechanical or other physical properties occur throughout the plastomer layer.

It also goes without saying that the terms "upper surface" and "lower surface" are merely used to identify the two surfaces which are characteristic to a woven fabric and should not be interpreted as actually limiting the woven fabric to facing a certain up or down positioning.

An additional example of a flexible support that may be used in accordance with the invention is a support comprising a fabric containing high strength polyethylene fibers, more preferably high strength UHMWPE fibers and which is impregnated with a thermoplastic material chosen from the group consisting of a polyvinylchloride, an ethylene vinyl acetate (EVA), a rubber and a polyurethane. Although such supports have less good mechanical stability, they may be used in accordance with the invention. Methods for manufacturing such substrates can be found in e.g. U.S. Pat. No. 6,280,546, included herein by reference.

Preferred woven fabrics for use according to the invention are fabrics having a cover factor of at least 1.5, more preferably at least 2, most preferably at least 3. Preferably, said cover factor is at most 30, more preferably at most 20, most preferably at most 10. It was observed that the use of such fabrics lead to an optimum impregnation of the woven fabric minimizing the amount of voids or air pockets contained by e.g. the flexible support. It was furthermore observed that a more homogeneous flexible support is obtained, i.e. a support having less local variations of its mechanical properties. The impregnation with a plastomer can be carried out for example by forcing under pressure the molten plastomer through said fiber and/or yarns.

The support used in accordance with the invention may be considered flexible when by placing on the edge of a table a square sample of the support, wherein part of the length of said support being in contact with and supported by the table and the remaining length extending freely over a distance L=200×(thickness of the sheet) from the edge of said table, said remaining length deflects by at least 0.1×L below the level of the table. Flexible supports having different flexibilities may be obtained by choosing an appropriate combination of fabric weave, amount of impregnating material, e.g. plastomer, and degree of impregnation.

The plastomer used in accordance with the invention is a plastic material that belongs to the class of thermoplastic materials. According to the invention, said plastomer is a semi-crystalline copolymer of ethylene or propylene and one or more C2 to C12 α-olefin co-monomers, said plastomer having a density of between 860 and 930 kg/m³. It was observed that a flexible support containing the plastomer showed a good shrinkage resistance when the plastomer was manufactured by a single site catalyst polymerization process, preferably said plastomer being a metallocene plastomer, i.e. a plastomer manufactured by a metallocene single site catalyst. Ethylene is in particular the preferred co-monomer in copolymers of propylene while butene, hexene and octene are being among the preferred α-olefin co-monomers for both ethylene and propylene copolymers.

In a preferred embodiment, said plastomer is a thermoplastic copolymer of ethylene or propylene and containing as co-monomers one or more α-olefins having 2-12 C-atoms, in particular ethylene, isobutene, 1-butene, 1-hexene, 4-methyl-1-pentene and 1-octene. When ethylene with one or more C3 C12 α-olefin monomers as co-monomers is applied, the amount of co-monomer in the copolymer usually is lying between 1 en 50 wt. %, and preferably between 5 and 35 wt. %. In case of ethylene copolymers, the preferred co-monomer is 1-octene, said co-monomer being in an amount of between 5 wt % and 25 wt %, more preferably between 15 wt % and 20 wt %. In case of propylene copolymers, the amount of co-monomers and in particular of ethylene co-monomers, usually is lying between 1 en 50 wt. %, and preferably between 2 and 35 wt %, more preferably between 5 and 20 wt. %. Good results in terms of shrinkage may be obtained when the density of the plastomer is between 880 and 920 kg/m³, more preferably between 880 and 910 kg/m³.

Better resistance to shrinkage may be obtained when the plastomer used according to the invention has a DSC peak melting point as measured according to ASTM D3418 of between 70° C. and 120° C., preferably between 70° C. and 100° C., more preferably between 70° C. and 95° C.

A plastomer manufactured by a single site catalyst polymerization process and in particular a metallocene plastomer is distinguished from ethylene and propylene copolymers that have been manufactured with other polymerization techniques, e.g. Ziegler-Natta catalysation, by its specific density.

Said plastomer also differentiates itself by a narrow molecular weight distribution, Mw/Mn, the values thereof preferably being between 1.5 en 3 and by a limited amount of long chain branching. The number of long chain branches preferably amounts at most 3 per 1000 C-atoms. Suitable plastomers that may be used in the flexible sheet of the invention and obtained with the metallocene catalyst type are manufactured on a commercial scale, e.g. by DEXPlastomers, ExxonMobil, Mitsui and DOW under brand names as Exact, Exceed, Vistamaxx, Tafmer, Engage, Affinity and Versify, respectively. A description of plastomers and in particular of metallocene plastomers as well as an overview of their mechanical and physical properties can be found for instance in Chapter 7.2 of "Handbook of polypropylene and polypropylene composites" edited by Harutun G. Karian (ISBN 0-8247-4064-5) and more in particular in subchapters 7.2.1; 7.2.2; and 7.2.5 to 7.2.7 thereof, which are included herein by reference.

It is also possible to use compositions comprising the plastomer used in accordance with the invention and other thermoplastic materials and/or even other plastomer grades. In a preferred embodiment, a blend containing the plastomer and a functionalized polyolefin are used in accordance with the invention. Preferably the functionalized polyolefin is in an amount of between 1 wt % and 99 wt % of the blend weight, more preferably between 2.5 wt % and 50 wt %, more preferably between 5 wt % and 25 wt %. The functionalized polyolefin is preferably functionalized with a bifunctional monomer, the amount of the bifunctional monomer being between 0.1 wt % and 10 wt %, more preferably between 0.35 wt % and 5 wt %, most preferably between 0.7 wt % and 1.5 wt % of the weight of the polyolefin. Preferably the polyolefin used for functionalisations is also a plastomer, more preferably said polyolefin is the plastomer used in accordance with the invention. Preferably the polyolefin is functionalized with a bifunctional monomer such as maleicanhydride (MA) or vinyltrimethoxysilane (VTMOS). MA and VTMOS functionalized polyolefin's are commercially available products and the functionalization of the polyolefin may be carried out in accordance with known methods in the art, e.g. in an extrusion process, using peroxide as initiator. The advantage of using a functionalized polyolefin, preferably a functionalized plastomer is that the mechanical stability of the flexible support used in accordance with the invention may be improved.

Good shrinkage resistance may be obtained when the amount of plastomer was chosen to yield a flexible support having an areal density (AD) that is with at least 20%, more preferably at least 50% higher than the AD of the fabric, preferably of the woven fabric, utilized therein. Preferably the flexible support has an areal density (AD) that is with at most 500%, more preferably at most 400%, most preferably at most 300% higher than the AD of the fabric, preferably of the woven fabric, utilized therein. Good results may be obtained when the plastomer encapsulates the fabric which is preferably a woven fabric and the amount of plastomer was chosen as indicated hereinabove. AD is expressed in $kg/m^2$ and is obtained by weighing a certain area, e.g. 0.01 $m^2$ and dividing the obtained mass by the area of the sample.

The plastomer used in accordance with the invention may also contain various fillers and/or additives as defined hereinafter. In a preferred embodiment, the flexible support comprises a woven fabric, a plastomer layer as defined hereinabove and optionally various fillers and/or additives as defined hereinafter added to the plastomer. It was observed that an electrical generator of the invention comprising a flexible support in accordance with this embodiment may show a reduced shrinkage while being strong and lightweight. Moreover, said support may easily be sealed along a seam by heat welding, which provides a strong seal and results in overall time and cost savings.

Examples of fillers include reinforcing and non-reinforcing materials, e.g. carbon black, calcium carbonate, clay, silica, mica, talcum, and glass. Examples of additives include stabilizers, e.g. UV stabilizers, pigments, antioxidants, flame retardants and the like. Preferred flame retardants include aluminum tryhidrate, magnesium dehydrate, ammonium polyphosphate and others. The amount of flame retardants is preferably from 1 to 60, more preferably from 5 to 30 by weight percent of the amount of thermoplastic material contained by the flexible support. Most preferred flame retardant is ammonium phosphate, e.g. supplied by Budenheim (Budit) and Clariant (Exolit)

A flexible support can be manufactured according to known methods in the art. Examples of such methods are disclosed in U.S. Pat. No. 5,773,373 and U.S. Pat. No. 6,054,178 included herein by reference. Preferably, the flexible support is manufactured by a lamination method as for example the one disclosed in U.S. Pat. No. 4,679,519 included herein by reference, said method being routinely adapted to the materials used in the present invention.

Preferably, the thickness of the flexible support is between 0.2 mm and 10 mm, more preferably between 0.3 mm and 5 mm. The thickness of said flexible support is dependent upon the nature of the woven fabric in relation to the weave and the thickness and the quantity of thermoplastic material if used. The AD of said flexible support is preferably between 0.2 and 3, more preferably between 0.2 and 2 $kg/m^2$.

When the flexible support comprises a fabric and in particular a woven fabric which is encapsulated by the plastomer, said fabric can be positioned in the center of said flexible support or off center. Good results in terms of shrinkage may be obtained when the fabric was positioned as close as possible to the center of the flexible support.

Preferably, the flexible support has a total shrinkage, i.e. the average shrinkage in the warp and the weft directions of the woven fabric, of less than 1.5%, more preferably of less than 1.2%, even more preferably of less than 1.0%, yet even more preferably of less than 0.8%, yet even more preferably of less than 0.6%, most preferably of less than 0.45% when measured according to the methodology disclosed hereinafter in the *"METHODS OF MEASUREMENT"* section of the present document. Preferably, the flexible support has a shrinkage in the warp direction of less than 1%, more preferably less than 0.6%. Preferably, the flexible support has a shrinkage in the weft direction of less than 1%, more preferably less than 0.5%.

It was observed that good results in terms of shrinkage may be obtained for flexible supports having lateral dimensions of relatively large size, e.g. a width and length for rectangular sheets of at least 100 mm.

According to the invention, the photovoltaic device is attached to the flexible support. The skilled person knows how to attach a photovoltaic device to a flexible support, e.g. from CN2838046 or CN101132031.

A particularly preferred method for attaching a photovoltaic device to a flexible support comprises the steps of:
a) providing at least one photovoltaic device, preferably of a flexible type;
b) providing a flexible support comprising high-strength polymeric fibers, preferably said support comprising a woven fabric comprising high-strength polymeric fibers; wherein said fibers are preferably polyethylene fibers, more preferably UHMWPE fibers;

c) placing the at least one photovoltaic device on the flexible support; and
d) laminating a layer of a thermoplastic material over the flexible support and over the at least one photovoltaic device.

All thermoplastic materials are suitable for use in the lamination step d) hereinabove. Most preferred thermoplastic material for use in said lamination step d) is the plastomer utilized in accordance with the invention, said plastomer being a semi-crystalline copolymer of ethylene or propylene and one or more C2 to C12 α-olefin co-monomers and wherein said plastomer having a density as measured according to ISO1183 of between 860 and 930 kg/m$^3$. Preferred embodiments of said plastomer are detailed hereinabove.

During the lamination step d), the thermoplastic layer will have a portion laminated over the at least one photovoltaic device and a portion laminated over the flexible support. Care should be taken to adjust the thickness of the layer of thermoplastic material such that the portion of said layer which is laminated over the at least one photovoltaic device is substantially transparent. By substantially transparent is herein understood that said layer is transparent enough to allow the light to reach the active region of the photovoltaic device such that electricity may be generated. The skilled person can routinely adjust the thickness of the laminated layer of thermoplastic material. For example the portion of the layer of thermoplastic material which is laminated over the at least one photovoltaic device may have a thickness of at most 100 μm, preferably of at most 50 μm, more preferably of at most 10 μm, most preferably of at most 3 μm.

A further preferred method for attaching a photovoltaic device to a flexible support comprises the steps of:
a) providing at least one photovoltaic device, preferably of a flexible type;
b) providing a flexible support comprising high-strength polymeric fibers, preferably said support comprising a woven fabric comprising high-strength polymeric fibers; wherein said fibers are preferably polyethylene fibers, more preferably UHMWPE fibers;
c) laminating a molten layer of a thermoplastic material over the flexible support;
d) placing the at least one photovoltaic device on the laminated flexible support to create a contact area between the molten layer of thermoplastic material and the at least one photovoltaic device; and
e) cooling the molten layer of thermoplastic material to below its melting temperature.

Preferably, the thermoplastic material is the plastomer used in accordance with the invention.

The present invention relates furthermore to various products containing the flexible electrical generator of the invention. Examples of products include but are not limited to cargo and container covers, ground covers, roofing, and building covers, liners, sails, tarpaulins, awnings, sails, bags, inflated structures, tents and the like.

The invention will be further explained with the help of the following examples without being however limited thereto.

Methods of Measurement

IV: the Intrinsic Viscosity of UHMWPE is determined according to method PTC-179 (Hercules Inc. Rev. Apr. 29, 1982) at 135° C. in decalin, the dissolution time being 16 hours, with DBPC as anti-oxidant in an amount of 2 g/l solution, by extrapolating the viscosity as measured at different concentrations to zero concentration.

Cover factor: of a woven fabric is calculated by multiplying the average number of individual weaving yarns per centimeter in the warp and the weft direction with the square root of the linear density of the individual weaving yarns (in tex) and dividing by 10.

An individual weaving yarn may contain a single yarn as produced, or it may contain a plurality of yarns as produced said yarns being assembled into the individual weaving yarn prior to the weaving process. In the latter case, the linear density of the individual weaving yarn is the sum of the linear densities of the as produced yarns.

The cover factor (CF) can be thus computed according to formula:

$$CF = \frac{m}{10}\sqrt{pt} = \frac{m}{10}\sqrt{T}$$

wherein m is the average number of individual weaving yarns per centimeter, p is the number of as produced yarns assembled into a weaving yarn, t is the linear density of the yarn as produced (in tex) and T is the linear density of the individual weaving yarn (in tex).

Dtex: of a fiber was measured by weighing 100 meters of fiber. The dtex of the fiber was calculated by dividing the weight in milligrams by 10.

Shrinkage: a square sample of 0.4 m length and 0.4 m width, was placed in the drum of a laundry machine and rotated in the absence of water at a rotating speed of 60 rot/min for 72 hours at a temperature of about 23° C. and humidity of about 65% together with a number of 5 clay balls. Each clay ball had a mass of 0.22 Kg and a diameter of about 50 mm, the surface of each ball being covered with a cotton fabric by placing the ball in a cotton bag which tightly accommodates the ball. The dimensions of the sample were measured before and after the treatment and the difference thereof (expressed in %) was considered representative for the shrinkage of the sample.

Tensile properties, i.e. strength and modulus, of polymeric fibers were determined on multifilament yarns as specified in ASTM D885M, using a nominal gauge length of the fibre of 500 mm, a crosshead speed of 50%/min and Instron 2714 clamps, of type Fibre Grip D5618C. For calculation of the strength, the tensile forces measured are divided by the titre, as determined by weighing 10 meters of fibre; values in GPa are calculated assuming the natural density of the polymer, e.g. for UHMWPE is 0.97 g/cm$^3$.

The tensile properties of polymeric tapes: tensile strength and tensile modulus are defined and determined at 25° C. on tapes of a width of 2 mm as specified in ASTM D882, using a nominal gauge length of the tape of 440 mm, a crosshead speed of 50 mm/min.

The tensile strength and modulus of inorganic fibers and in particular of glass fibers was measured according to ASTM D4018-81 at 22° C.

Tensile modulus of thermoplastic materials was measured according to ASTM D-638(84) at 25° C.

EXAMPLES AND COMPARATIVE EXPERIMENT

Example 1

A basket woven fabric having an AD of 0.193 kg/m$^2$, a thickness of about 0.6 mm and a width of about 1.72 m, and containing 880 dtex polyethylene yarns known as Dyneema® SK 65 was impregnated with Exact® 0203. Exact® 0203 is plastomer from DEXPlastomers and is an ethylene based octane plastomer with about 18% octane, a density of 902 kg/m³ and a DSC peak melting point of 95° C.

The plastomer was molten at a temperature of about 145° C. and discharged on a surface of the fabric.

A pressure of about 45 bars was applied to impregnate the plastomer into the fabric at a temperature of about 120° C. The above process was repeated in order to coat both surfaces of the woven fabric.

The obtained flexible support had a thickness of about 0.8 mm, an AD of 0.550 kg/m² and less than 40% voids. The AD of the support was 280% larger than the AD of the woven fabric. The plastomer layer was devised into:
- a first part of AD of about 0.175 kg/m² covering one surface;
- a second part impregnated through the fabric between the yarns and fibers thereof; and
- a third part having an AD of about 0.175 kg/m² covering the other surface.

The results are presented in Table 1.

Experiment 2

The polyethylene fabric used in Example 1 was covered with EVA according to the method described in Example 2 of U.S. Pat. No. 6,280,546.

Experiment 3 and 4

The fabric of Example 1 was impregnated with in one experiment (3) with neoprene rubber and in another (4) with polyurethane (from Barrday Inc, Canada) by a dipcoating process. The rubber was subsequently cured.

| Sample | Shrinkage in warp direction (%) | Shrinkage in weft direction (%) | Total shrinkage (%) |
| --- | --- | --- | --- |
| Example 1 | 0.96 | 0.42 | 0.69 |
| Example 3 | 3.10 | 1.30 | 2.20 |
| Example 4 | 5.00 | 3.95 | 4.47 |
| Example 2 | 1.60 | 2.25 | 1.92 |
| Uncoated fabric of polyethylene (COMPARATIVE EXPERIMENT) | 21.00 | 34.00 | 27.5 |

From the above examples it can be observed that a flexible support used in accordance with the invention shows a reduced shrinkage when compared to a known UHMWPE fabric.

The invention claimed is:

1. A flexible electrical generator comprising:
a flexible support comprising woven high-strength polymeric fibers and a plastomer impregnating the woven high-strength polymeric fibers, and at least one photovoltaic device attached to the flexible support, wherein the plastomer is a semi-crystalline copolymer of ethylene or propylene and one or more C2 to C12 α-olefin co-monomers, and wherein the plastomer has a density as measured according to ISO1183 of between 860 and 930 kg/m³.

2. The flexible electrical generator of claim 1, wherein the at least one photovoltaic device is a flexible photovoltaic device.

3. The flexible electrical generator of claim 1, wherein the woven high-strength polymeric fibers are polyolefin fibers.

4. The flexible electrical generator of claim 1, wherein the woven high-strength polymeric fibers comprise ultrahigh molecular weight polyethylene (UHMWPE) tapes.

5. The flexible electrical generator of claim 1, wherein the woven high-strength polymeric fibers have deniers in the range of from 0.5 to 20.

6. The flexible electrical generator of claim 1, wherein the high-strength polymeric fibers have a tensile strength of at least 0.5 GPa.

7. The flexible electrical generator of claim 1, wherein the plastomer has a tensile modulus of at most 0.6 GPa.

8. The flexible electrical generator of claim 1, wherein the fabric is a woven fabric having a cover factor of at least 1.5.

9. The flexible electrical generator of claim 1, wherein the plastomer has a DSC peak melting point as measured according to ASTM D3418 of between 70° C. and 120° C.

10. The flexible electrical generator of claim 1, wherein the plastomer is a blend of a plastomer and a functionalized polyolefin.

11. The flexible electrical generator of claim 1, wherein the flexible support has a width and a length for rectangular sheets of at least 100 mm.

12. A method for attaching a photovoltaic device to a flexible support comprising the steps of:
a. providing at least one photovoltaic device, preferably of a flexible type;
b. providing a flexible support comprising high-strength polymeric fibers;
c. placing at least one photovoltaic device on the flexible support; and
d. laminating a layer of a thermoplastic material, wherein said thermoplastic material is preferably a plastomer over the flexible support and over the at least one photovoltaic device.

13. A method for attaching a photovoltaic device to a flexible support comprising the steps of:
a. providing at least one photovoltaic device, preferably of a flexible type;
b. providing a flexible support comprising high-strength polymeric fibers;
c. laminating a molten layer of a thermoplastic material, wherein said thermoplastic material is a plastomer over the flexible support;
d. placing at least one photovoltaic device on the laminated flexible support to create a contact area between the molten layer of thermoplastic material and the at least one photovoltaic device; and
e. cooling the molten layer of thermoplastic material to below its melting temperature.

* * * * *